United States Patent [19]

Juskey et al.

[11] Patent Number: 5,019,673
[45] Date of Patent: May 28, 1991

[54] FLIP-CHIP PACKAGE FOR INTEGRATED CIRCUITS

[75] Inventors: Frank J. Juskey, Coral Springs; Barry M. Miles; Marc V. Papageorge, both of Plantation, all of Fla.

[73] Assignee: Motorola, Inc., Schaumberg, Ill.

[21] Appl. No.: 570,751

[22] Filed: Aug. 22, 1990

[51] Int. Cl.⁵ .................. H01L 23/28; H01L 39/02
[52] U.S. Cl. .................. 174/52.2; 357/72; 357/80
[58] Field of Search .............. 361/397, 400, 417, 418, 361/420; 357/72, 80; 174/52.2, 52.4

[56] References Cited

U.S. PATENT DOCUMENTS 3,331,912 7/1967 Stricker et al. ............... 174/52.2
3,689,804 9/1972 Ishihama et al. .............. 361/386
4,552,422 11/1985 Bennett et al. ................ 439/69
4,700,473 10/1987 Freyman et al. ............... 29/846
4,922,377 5/1990 Matsumoto et al. ............ 361/387
4,975,765 12/1990 Ackermann et al. ............ 357/80

Primary Examiner—Leo P. Picard
Assistant Examiner—Bot Lee Ledynh
Attorney, Agent, or Firm—Robert S. Babayi

[57] ABSTRACT

A flip-chip package for integrated circuits is provided by over-molding an integrated circuit assembly which includes a flip-chip mounted to a very thin chip carrier. The flip-chip includes an array of bumped pads which fill an array of matching conductive through holes on the chip carrier and securely couple thereto. The chip carrier includes an array of bumped contacts on its back surface which correspond to the bumped pads of the flip-chip. The transfer over molding of the integrated circuit assembly provides a layer of epoxy around the exposed surfaces of the flip-chip providing an environmentally protected and removable integrated circuit package.

2 Claims, 1 Drawing Sheet

FLIP-CHIP PACKAGE FOR INTEGRATED CIRCUITS

TECHNICAL FIELD

This invention relates generally to the field of integrated circuits and in particular to providing a flip chip package for an integrated circuit.

BACKGROUND

With the increasing size of large scale integrated circuit chips, the number of input and output connections that have to be made to a chip has correspondingly increased. This trend has encouraged the evolution from dual in-line chip packages, which have two parallel rows of connection pins, to smaller and more dense leadless chip carriers. Leadless chip carriers generally consist of a package containing a square plate of ceramic, such as alumina, which forms a chip carrier or base onto which a chip is mounted. The chip carrier is then surface mounted, usually onto a generally larger printed circuit (pc) board or other ceramic chip carriers, simply by placing the carrier on top of corresponding contact pads which mirror those contact pads of the chip carrier. An electrical and mechanical connection is then made by soldering the chip carrier to this generally larger board by reflow soldering. Electrical connection paths within the leadless chip carrier allow the pads of the chip to be brought to external contact pads formed around each of the four sides of the ceramic base of the carrier. One technique for providing the electrical connection path comprises wire bonding of the leads of the chip to the external contacts. During this process very thin wires may be manually or automatically placed between the chip pads and the chip carrier pads to provide the electrical connections. This arrangement is less cumbersome than mounting dual in-line packages onto a board and allows greater density of input and output connections to be achieved.

In order to eliminate the expense, and complexity of wire bonding process, a so called flip-chip technology was initiated. In this technology a bumped integrated circuit (bumped IC) which carries a pad arrangement on a major top surface is turned upside-down, i.e. flipped, allowing direct coupling between the pads and matching contacts on the main circuit board or the chip carrier. The direct connection is facilitated by growing solder or gold bumps formed on the IC input/output terminals. The flipped bumped IC is otherwise referred to as a flip-chip. The flip-chip is then aligned to the cip carrier and all connections are made simultaneously be reflowing the solder.

However, direct bonding of the flip-chip die to the chip carrier or the wire bonding process makes impossible the removal of the die for testing and/or repair purposes.

SUMMARY OF THE INVENTION

Accordingly, it is an object of the present invention to provide a removable and environmentally protected flip-chip package.

Briefly, according to the invention a flip-chip package comprises an assembly including a flip-chip having an array of bumped pads which provide terminals for an integrated circuit within the flip-chip. The flip-chip is coupled to top-surface of a chip carrier which includes an array of matching conductive through holes. The flip-chip is attached to the chip carrier by filling the conductive through-holes with the bumped pads of the flip-chip and providing secure connections therebetween. The chip carrier includes an array of bumped contact pads formed on bottom surface of the chip carrier. The assembly is molded with a curable epoxy to provide a protective layer around the exposed surfaces of the flip-chip.

DETAILED DESCRIPTION OF THE PREFERRED EMBODIMENT

Figure 1:
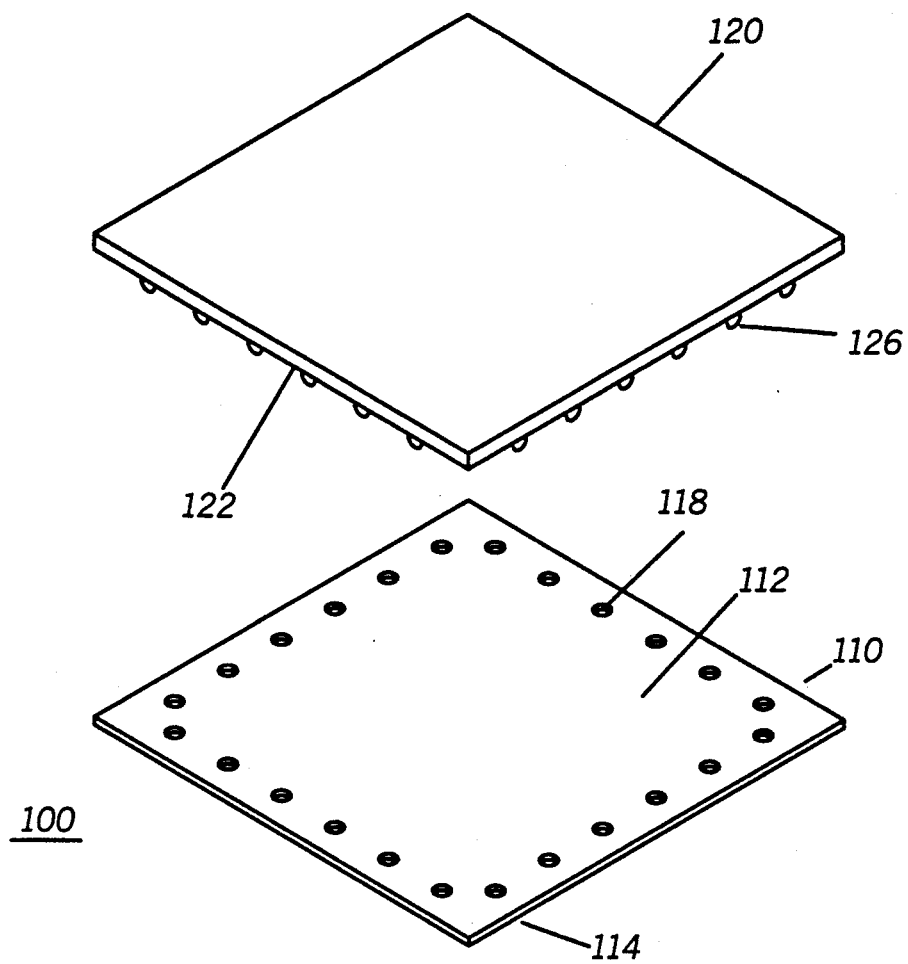
FIG. 1, is an exploded view of an integrated circuit assembly according to the present invention.

Referring to FIG. 1, an exploded view of an integrated circuit assembly 100 of the present invention includes a very thin chip carrier 110 made of any suitable ceramic or organic material, e.g. polyimide or FR-4. The chip carrier 110 includes a plurality of conductive through-holes 118 which extend from a top surface 112 to a bottom surface 114. The conductive through holes 118 are formed on the chip carrier by utilizing well known drilling and electroplating processes.

The chip carrier 110 comprises a base for mounting a flip-chip 120. The flip-chip 120 may comprise any conventional flip-chip which includes an integrated circuit being formed utilizing well known processes. The flip-chip 120 has a major bottom surface 122 which includes an arrangement of bumped pads 126. The bumped pads 126 provide the input and/or the output terminals of the integrated circuit of the flip-chip 120. In the preferred embodiment of the invention the bumped pads 126 comprise solder bumps which are grown on the flip-chip 120 utilizing well known masking and plating techniques.

The electrical assembly 100 is produced by placing and securing the flip-chip 120 on the top surface 112 of the chip carrier 110. The bumped pads 126 are aligned and inserted into the conductive holes and the flip-chip 120 is secured to the chip carrier 110 by reflowing solder formed on the bumped pads which fills the conductive holes 118 creating secure connections therebetween. The solder fillings provided by the bumped pads 126 seal the conductive holes 118 providing a flushed bottom surface 114. Preferably, the process of producing the integrated circuit assembly 100 including the alignment and the solder reflow operations are performed utilizing accurate automated component assembly processes.

Figure 2:
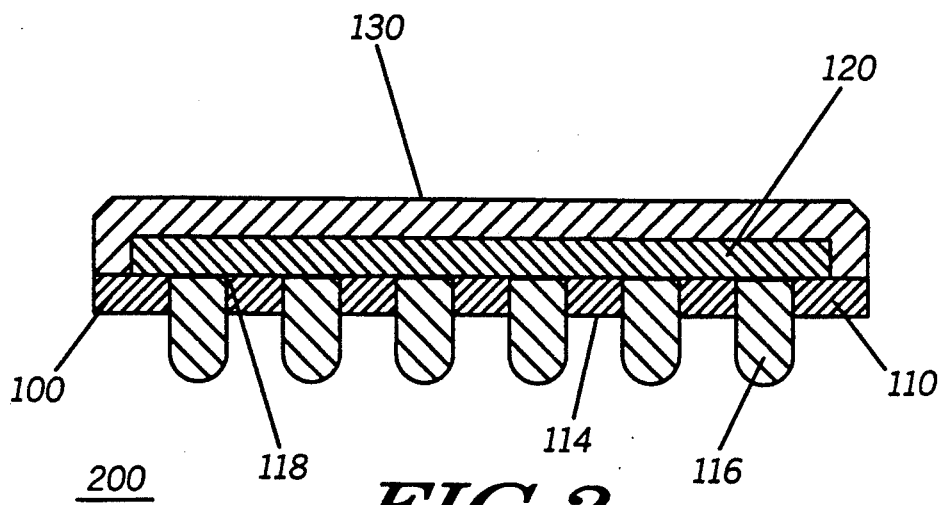
FIG. 2, is a cross sectional view of a flip-chip integrated circuit package according to the present invention.

Referring to FIG. 2, the cross sectional view of a flip-chip integrated circuit package 200 is shown. According to the present invention, the electrical assembly 100 is over-molded on five sides with an epoxy which forms a layer 130 over the exposed surfaces of the flip-chip 120. The over molding process is generally referred to a process where one side of the molded assembly is not covered with epoxy layer and is left open. The bottom side 114 of the integrated circuit assembly 100 is exposed for allowing placement of the package 200 on external circuitry. Preferably, the epoxy layer 130 comprise a low viscosity curable epoxy, such as novolac or cresole based epoxies. The molded flip-chip package 200 may be provided utilizing well known injection molding or other suitable techniques.

After the molding operation bumped contact pads 116 are provided on the on the bottom surface 114 of the chip carrier 110. In the preferred embodiment of the invention, the contact pads 116 comprise bumped pads grown on the bottom surface 114 and which are extended along the conductive holes 118. It may be appreciated that the bumped pads 116 may be positioned on the bottom surface by coupling a plurality of conductive runners which are disposed on the bottom surface 114 to the conductive holes 118 in any desired arrangement.

Accordingly, the flip-chip integrated circuit package 200 may be placed on a circuit board or be removed therefrom without inflicting any damages to the flip-chip 120. In this arrangement, the flip-chip integrated circuit package 200 may be tested, stored, or handled as an integral piece part.

What is claimed is:

1. An integrated circuit package, comprising:
   an integrated circuit assembly including:
   a flip-chip having an array of bumped pads positioned on a bottom surface for providing terminals of an integrated circuit formed within said flip-chip;
   a chip carrier being coupled to said flip-chip on a top major surface having through-holes being filled with said bumped pads of said flip-chip, said chip carrier includes an arrangement of contact pads formed on a major bottom surface which are correspondingly coupled to said bumped pads;
   said integrated circuit assembly being molded with a curable epoxy to provide a protective layer around exposed surfaces of said flip-chip.

2. The integrated circuit package of claim 1, wherein said contact pads comprise bumped pads.

* * * * *